United States Patent
Miller et al.

(10) Patent No.: US 10,014,657 B2
(45) Date of Patent: Jul. 3, 2018

(54) LASER-MACHINED OPTICAL COMPONENTS AND RELATED METHODS FOR PICK AND BOND ASSEMBLY

(71) Applicant: DOLBY LABORATORIES LICENSING CORPORATION, San Francisco, CA (US)

(72) Inventors: Gregory David Miller, San Jose, CA (US); Gennady Imeshev, Irvine, CA (US); James Thomas Triplett, Grants Pass, OR (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 0 days.

(21) Appl. No.: 15/329,436

(22) PCT Filed: Jul. 27, 2015

(86) PCT No.: PCT/US2015/042168
§ 371 (c)(1),
(2) Date: Jan. 26, 2017

(87) PCT Pub. No.: WO2016/018776
PCT Pub. Date: Feb. 4, 2016

(65) Prior Publication Data
US 2017/0219743 A1    Aug. 3, 2017

Related U.S. Application Data

(60) Provisional application No. 62/030,554, filed on Jul. 29, 2014.

(51) Int. Cl.
*H01S 5/02*     (2006.01)
*H01S 5/022*    (2006.01)
(Continued)

(52) U.S. Cl.
CPC ........ *H01S 5/02268* (2013.01); *G02B 3/0012* (2013.01); *H01S 5/005* (2013.01);
(Continued)

(58) Field of Classification Search
CPC .... H01S 5/005; H01S 5/02252; H01S 5/0261; H01S 5/02256; H01S 5/02268; H01S 5/02288; H01S 5/4025; G02B 3/0012
See application file for complete search history.

(56) References Cited

U.S. PATENT DOCUMENTS 5,358,597 A * 10/1994 Smith .................. C04B 41/009
                                                     216/100
5,369,659 A * 11/1994 Furumoto ............ G02B 6/4206
                                                     372/101
(Continued)

FOREIGN PATENT DOCUMENTS

JP   2004-109498   4/2004
WO   97/035811    10/1997
WO   02/065600    8/2002

OTHER PUBLICATIONS

Koh, Han-Jun, et al "On-Wafer Process for Mass Production of Hybridly Integrated Optical Components Using Passive Alignment on Silicon Motherboard" IEEE Electronic Components and Technology Conference, 1999 Proceedings, vol. 49, pp. 216-221.

*Primary Examiner* — Armando Rodriguez

(57) ABSTRACT

Methods and systems for optical assemblies are disclosed. Optical assemblies can comprise optical elements that may not require active alignment and allow for reduced performance variations. To allow for passive assembly with a machine like a bonder tool, assembly components can have bonding pads and/or fiducial markers that are fabricated using laser micromachining techniques.

4 Claims, 4 Drawing Sheets

(51) Int. Cl.
*G02B 3/00* (2006.01)
*H01S 5/00* (2006.01)
*H01S 5/026* (2006.01)
*H01S 5/40* (2006.01)

(52) U.S. Cl.
CPC ........ *H01S 5/0261* (2013.01); *H01S 5/02252* (2013.01); *H01S 5/02256* (2013.01); *H01S 5/02288* (2013.01); *H01S 5/4025* (2013.01)

(56) References Cited

U.S. PATENT DOCUMENTS

| | | | |
|---|---|---|---|
| 5,964,397 | A * | 10/1999 | Dautartas ............. G02B 6/4224 228/180.22 |
| 6,647,035 | B1 | 11/2003 | Freitas |
| 6,760,520 | B1 | 7/2004 | Medin |
| 6,862,378 | B2 | 3/2005 | Karnacewicz |
| 7,116,468 | B2 | 10/2006 | Miller |
| 7,167,618 | B2 | 1/2007 | Kobayashi |
| 7,265,896 | B2 | 9/2007 | Miller |
| 7,265,897 | B2 | 9/2007 | Miller |
| 7,289,261 | B2 | 10/2007 | Miller |
| 7,423,802 | B2 | 9/2008 | Miller |
| 2003/0048819 | A1 | 3/2003 | Nagano |
| 2007/0133082 | A1 | 6/2007 | Miller |
| 2007/0297732 | A1 | 12/2007 | Mason |
| 2008/0025350 | A1 | 1/2008 | Arbore |
| 2008/0226229 | A1 | 9/2008 | Nakagawa |
| 2008/0247439 | A1 | 10/2008 | Uchida |
| 2011/0216998 | A1 | 9/2011 | Symington |

* cited by examiner

LASER-MACHINED OPTICAL COMPONENTS AND RELATED METHODS FOR PICK AND BOND ASSEMBLY

CROSS-REFERENCE TO RELATED APPLICATIONS

This application claims priority to U.S. Provisional Patent Application No. 62/030,554 filed 29 Jul. 2014, which is hereby incorporated by reference in its entirety.

TECHNICAL FIELD

The present disclosure relates to optical assemblies. More particularly, it relates to laser-machined optical components and related methods for pick and bond assemblies.

BACKGROUND

Discrete optical elements that form an optical assembly need to be positioned precisely with respect to each other. Currently, to achieve precise positioning of the optical elements and thus the required assembly performance, time-consuming active adjustment procedures are employed. During such procedures, light beams propagating through the optical elements can be used for alignment. Optical performance parameters can be measured and used as feedback for adjusting the positioning of the optical elements. After such active adjustment procedures, optical elements can then be fixed in place.

Additionally, multi-element optical components such as microlens arrays can exhibit significant element-to-element variations, adversely affecting overall assembly performance. In other words, the non-perfect uniformity of optical elements, as well as optical distortion normally present in manufactured optical elements, may introduce errors in the alignment.

It would be advantageous to eliminate the need for active alignments and extract the performance gains obtained from reduced element-to-element variations. The present disclosure describes optical elements, fabrication and assembly methods to attain these advantages.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

SUMMARY

In a first aspect of the disclosure, an optical assembly is described, the optical assembly comprising: an optical motherboard; a laser-machined laser diode bar on a surface of the optical motherboard; and a laser-machined microlens array on the surface of the optical motherboard, wherein the laser-machined microlens array is aligned to the laser-machined laser diode bar so that electromagnetic waves emitted by the laser diode enter the microlens array.

DETAILED DESCRIPTION

The present disclosure describes an optical assembly comprising optical elements, as well as fabrication and assembly methods that may not require active alignment and allow for reduced performance variations. In order to allow for passive assembly with a machine like a bonder tool, assembly components can have bonding pads and/or fiducial markers that are fabricated using laser micromachining techniques.

Optical Assembly

Figure 1:
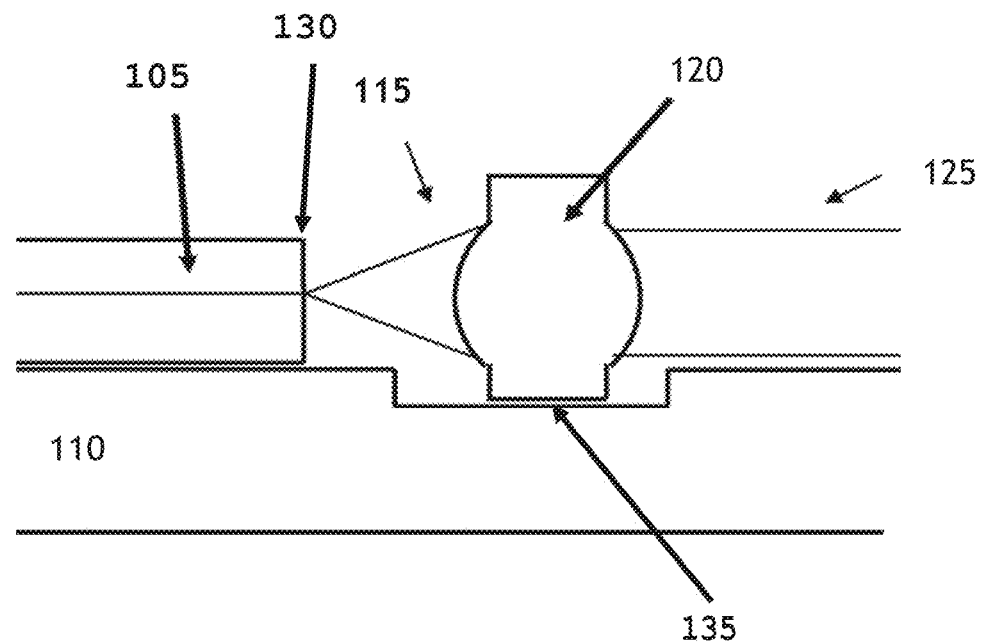
FIG. 1 illustrates an overview of one embodiment of an optical assembly with optical elements (laser diode bar and microlens array).

The present disclosure describes an optical assembly that comprises a laser diode bar and a microlens array that can be passively assembled on an optical motherboard (FIG. 1).

It is understood that the embodiment of FIG. 1 is a specific example of a more general case of optical elements that can be passively assembled on an optical motherboard. Optical elements and an optical motherboard are collectively referred to here as assembly components.

To allow for passive assembly with a machine like a bonder tool (e.g. pick, place and bond tool), assembly components can have bonding pads and/or one or more fiducial markers. It is understood that such bonding pads and/or fiducial markers and/or assembly components (or their features) can be fabricated using laser micromachining techniques.

In FIG. 1, a laser diode bar (105) is assembled on an optical breadboard (110). A laser diode bar is an array of diodes that can lase at a desired frequency. In FIG. 1, electromagnetic waves, that is the laser light, are visible as a trace (115) in a standard optical convention diagram, as understood by the person skilled in the art. The trace (115) is depicted before entering the microlens array (120), and after exiting (125). The microlens array (120) is an array of microlenses which can be fabricated with microfabrication techniques, such as laser machining.

Fiducial Markers

Fiducial markers (130) are marks that are used for alignment of parts during multi-step fabrication processes. Fiducial markers recognizable by a machine vision system allow for a sub-micron placement of parts by an automated tool. In the present disclosure, fiducial markers can be purposely inscribed on all or some of the assembly components, for example using laser micromachining techniques. In other embodiments, all or some assembly components may have integral features that can be effectively used as fiducial markers. For example, a laser diode bar can be typically coated with a gold layer. Such coating would smear any fiducial markers on its top surface. Additionally, the endface of the diode bar can be cleaved with positioning accuracy of few microns. On the other hand, the laser bar has ridges on top of the chip that run perpendicular to the endface plane. Points where these ridges meet the endface can be used as fiducial markers (130) for the machine vision system.

In the present disclosure bonding pads (135) can be fabricated on all or some of the assembly components. In some embodiments, hard-contact "waffle pad" and the appropriate bonding method (like soldering) can be used. This allows for a precise passive vertical positioning of the optical elements on the optical motherboard. In other embodiments, other types of pads and bonding methods can be used.

Bonding Pads

In the present disclosure bonding pads can be fabricated on all or some of the assembly components. In some embodiments, hard-contact "waffle pad" and the appropriate bonding method (like soldering) can be used. This allows for a precise passive vertical positioning of the optical elements on the optical motherboard. In other embodiments, other types of pads and bonding methods can be used.

Fabrication of Assembly Components

Fabrication of assembly components (e.g. optical elements and motherboard) can comprise some or all of the following steps, not necessarily in the order listed:

1. laser micromachining of the blanks/substrates, comprising surfaces, fiducial markers, bonding pads and other features;
2. optional re-flow step to improve optical quality (ex. laser assisted re-flow, fire-polish, and others);
3. metallization.

Laser micromachining comprises the fabrication of elements with the use of laser, for example laser ablation, cutting or heating. A re-flow step may comprise localized or non-localized heating of a material to allow soldering. For example, re-flow soldering can be a process in which a solder paste can be used to temporarily attach one or several electrical components to their contact pads. Afterwards, the entire assembly or some of its parts can be subjected to controlled heat, which melts the solder, permanently connecting the joint. Laser-assisted re-flow can comprise a similar process, using localized heating with one or more laser beams.

Metallization may comprise adding metallic traces, contacts or electrodes as understood by the person skilled in the art, and as can be necessary for the operation of a device.

It is understood that various optical elements can be fabricated using methods described here, including but not limited to: lenses, microlens arrays, diffraction gratings, prisms, mirrors, planar lightwave circuits and their elements (ex. waveguides). Some or all of these optical elements may be integrated in the devices of the present disclosure.

In some embodiments, fiducial markers, bonding pads, features of a component, an entire component, or some combination of these elements can be fabricated during the same fabrication step to ensure precise relative registration.

In some embodiments, laser micromachining can involve ablation of a material from the surface of a workpiece (blank or substrate). Such ablation can be carried out in one step, two steps (for example, coarse and fine material removal), or in multiple steps.

In some embodiments, tightly focused femtosecond pulses can be used for precise, ablative material-removal. In other embodiments, few-picosecond pulses and even longer pulses, up to few nanoseconds and longer, can be used for ablative material removal. For example, the use of sub-nanosecond pulses in the UV spectral range (ex. at about 355 nm) can allow the achievement of low damage/ablation processing thresholds and high precision micromachining. As another example, nanosecond UV pulses can be used for high throughput.

In some embodiments, instead of ablative material removal from the surface of a blank, the index of refraction of a material can be modified in the bulk of the material using focused laser pulses. This process can be used to create or modify optical elements like (gradient-index optics) GRIN lenses, waveguide circuits and others. In some embodiments, tightly focused femtosecond pulses can be used for precise index modification. In other embodiments, few-picosecond pulses, that is pulses with a duration in the picoseconds range, can be used for refractive index modification. In other embodiments, longer pulses, up to a few nanoseconds in duration for each pulse, can be used for refractive index modification.

Yet another alternative is to use laser micromachining for both surface ablation and bulk index modification to fabricate components with a required performance.

To obtain the best throughput and component performance, the laser processing parameters can be carefully optimized. Some examples of such parameters for laser processing are: scan speed, overlap, number of passes, pulse length, repetition rate, wavelength, polarization, focusing conditions, and others. Such an optimization can be particularly important for optical surfaces. It is understood that different laser parameters may need to be used to perform different processing steps.

Optical Motherboard

A motherboard can contain a topology for bonding pads, pockets, pedestals, etc., for positioning of optical elements and to allow for passive alignment of optical elements to each other. Such optical motherboard can provide provisions for electronic components (ex. circuit traces) and/or thermal management features, such as heat spreaders.

An optical motherboard can have a topology and/or features that are laser-machined or be entirely laser-machined. An optical motherboard can be fabricated, for example, on an Au/Ti-coated MN substrate.

Microlens Array

In some embodiments, a microlens array can be used for collimation of beams emitted by a laser diode bar. In some embodiments, the bar can have 2-150 regularly-spaced (for example, a 150-um-pitch) emitters arranged as a linear array. The microlens array can have a corresponding number of lenses and spacing between them. In some embodiments, each microlens of the array can correspond to one diode of the diode bar. In some embodiments, two elements are used for collimation along the fast and slow axes of the output laser beam. Molds can be used to fabricate microlens arrays. Due to non-uniform cooling and shrinkage during the fabrication process, noticeable lens-to-lens as well as array-to-array variations can occur. This can lead to a need for a time-consuming active alignment of microlens array, as well as to performance degradation of the overall optical assembly.

In some embodiments of the present disclosure invention, the microlens array can be fabricated using laser micromachining techniques. Such techniques can allow for a more consistent and precise fabrication of the microlens array. Fiducial markers and bonding pads can be fabricated during the same step as the lens fabrication to ensure precise registration.

It is understood that techniques described in the present disclosure apply not only to linear (1D) microlens arrays but to 2D microlens arrays as well.

During the laser micromachining step, excess material can be ablated from the blank. A variety of scanning patterns can be used for the laser, for example, spiral, raster, helix, compound patterns and others. Flexible optical surfaces can be produced, for example, spherical, aspherical, or freeform surfaces. Fresnel lenses can also be produced by laser micromachining Additionally, a single microlens element can be designed and fabricated to collimate the output laser beam along both fast and slow axes.

Figure 2:
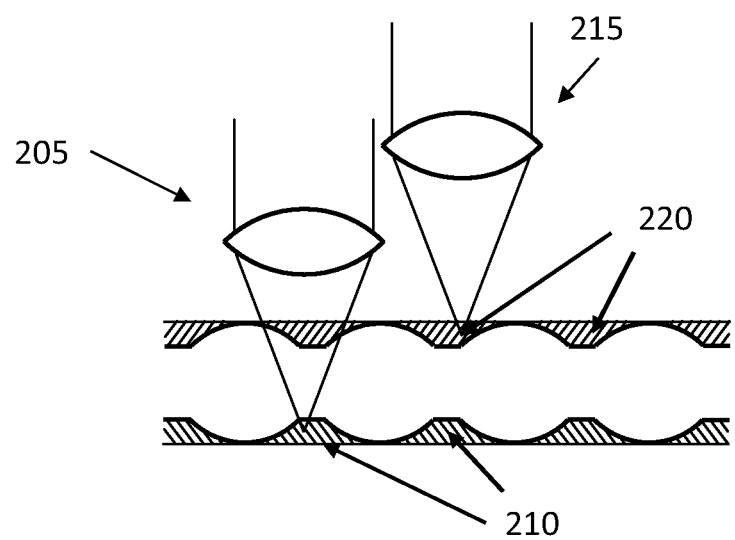
FIG. 2 illustrates an example of a laser ablation method.

It may be advantageous to produce a microlens array where lenses have two curved surfaces (i.e., convex-convex lenses). It could require micromachining of two sides of the originally flat blank, as opposed to micromachining of one side required for fabrication of plano-convex lenses. With laser micromachining it is possible to achieve that during the same processing step. First the laser beam is focused through the blank to ablate material on the bottom, and then the focus is raised to ablate the top surface (FIG. 2). With this approach two curved surfaces can be automatically registered to each other.

In FIG. 2, a laser (205) can be used to ablate material at a certain depth (210), by focusing it at the desired first depth. The laser can then be used with a different focus (215) to ablate material at a desired second depth (220).

Alternatively, instead of ablative material removal from the surface of a blank, index of refraction can be modified in the bulk of the blank using focused laser light. This can be used to create graded-index (GRIN) lenses or similar lenses, which have a gradual variation (e.g., spherical, axial, or radial gradient) of the refractive index. Preferably, tightly focused femtosecond pulses are used for precise index modification. In other embodiments, pulses with a duration of a few picosecond can be used. In other embodiments, longer durations can be used, for example of the order of a few nanoseconds.

Yet another alternative is to use both surface ablation and bulk index modification to create lenses with required refractive parameters.

Assembly Process

Optical elements can be passively assembled on an optical motherboard using a machine similar to a conventional bonder tool. The tool relies on fiducial markers to precisely position optical elements and then bond them to the motherboard.

In some embodiments, solder can be used to bond optical components to the mother board. For example, AuSn solder can be used on an Au/Ti-coated AlN breadboard, in conjunction with appropriately designed bonding pads.

In other embodiments, other bonding methods in conjunction with appropriately designed bonding pads can be used. For example, adhesive bonding, welding, contact bonding, snap-on attachment (requiring a negative draft on one part and a flexure feature(s) on the mating part), or others.

In some embodiments, some elements can be bonded to each other before bonding to the optical motherboard. For example, a microlens array can be bonded to a laser diode bar and/or two microlens arrays can be bonded to each other first. The resulting sub-assembly can then be bonded to the optical mother board.

Figure 3:
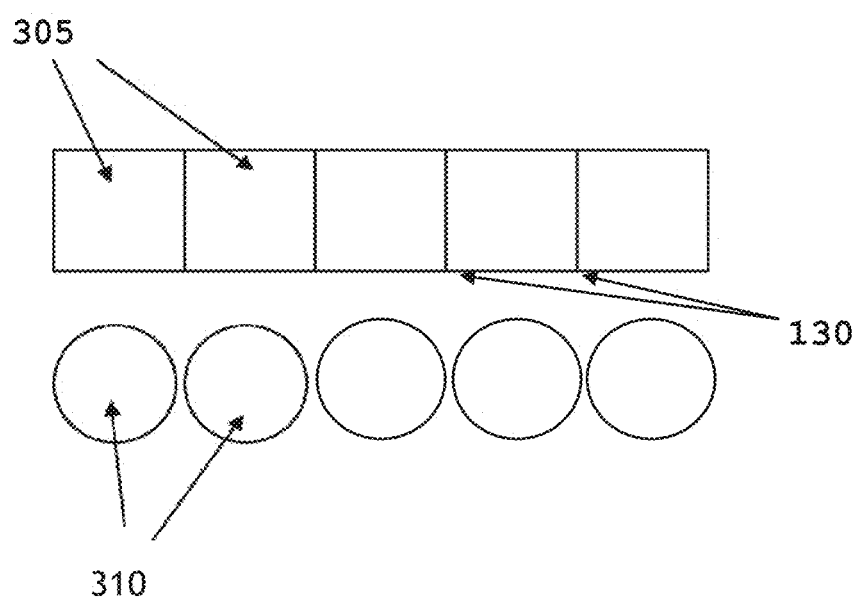
FIG. 3 illustrates an example of a laser diode bar and microlens array.

FIG. 3 illustrates an example of a laser diode bar, where several diode emitters (305) are aligned in a bar. A microlens array is also visible, comprising an array of microlenses (310). In FIG. 3 each of the emitters (305) is aligned in front of a microlens (310).

Figure 4:
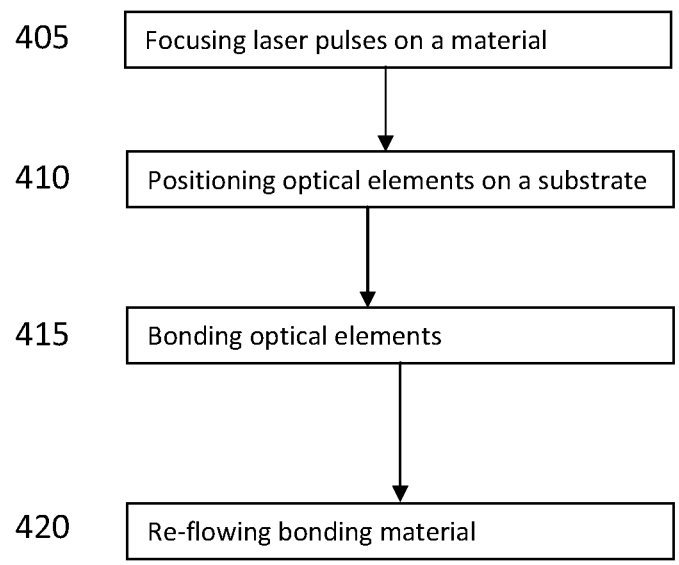
FIG. 4 illustrates an exemplary flowchart for the methods of the present disclosure.

FIG. 4 illustrates an exemplary method to laser machine optical elements. For example, a first step (405) may comprise focusing laser pulses on a material. By ablation or changes in the crystal structure of the material, a laser diode bar or a microlens array may be fabricated.

In a second step (410), fabricated optical elements may be positioned on a substrate, such as an optical motherboards. In a third step (415), bonding of the optical elements may be carried out. Optionally, in a fourth step (420), re-flowing of bonding material may be carried out.

In the present disclosure, machining and micro-machining is intended to refer to any step of fabrication as described in the present disclosure, both above, at and below the micrometer range. Laser machining and laser micro-machining is intended to refer to any machining or micro-machining step which utilizes a laser.

A number of embodiments of the disclosure have been described. Nevertheless, it will be understood that various modifications may be made without departing from the spirit and scope of the present disclosure. Accordingly, other embodiments are within the scope of the following claims.

The examples set forth above are provided to those of ordinary skill in the art as a complete disclosure and description of how to make and use the embodiments of the disclosure, and are not intended to limit the scope of what the inventor/inventors regard as their disclosure.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

What is claimed is:

1. An optical assembly comprising:
    an optical motherboard;
    a laser-machined laser diode bar on a surface of the optical motherboard;
    a laser-machined microlens array on the surface of the optical motherboard; and
    fiducial markers and bonding pads on at least a portion of the optical motherboard, the laser-machined microlens array, and the laser-machined laser diode bar;
    wherein:
    the laser-machined microlens array is aligned by the fiducial markers to the laser-machined laser diode bar so that electromagnetic waves emitted by the laser diode enter the microlens array,
    the laser-machined microlens array and the laser-machined laser diode are bonded to the optical motherboard by the bonding pads, and
    the laser-machined microlens array is aligned by the fiducial markers to the laser-machined laser diode bar with a sub-micrometer tolerance.

2. The optical assembly of claim 1, wherein the laser diode bar comprises between 2 and 150 regularly-spaced emitters arranged as a linear array.

3. The optical assembly of claim 2, wherein the emitters are spaced with a 150 micrometers pitch.

4. The optical assembly of claim 1, wherein the optical motherboard is fabricated from a Au/Ti-coated AlN substrate.

\* \* \* \* \*